United States Patent
Kubota et al.

(10) Patent No.: US 10,612,157 B2
(45) Date of Patent: Apr. 7, 2020

(54) METHOD FOR MANUFACTURING SIC COMPOSITE SUBSTRATE, AND METHOD FOR MANUFACTURING SEMICONDUCTOR SUBSTRATE

(71) Applicants: Shin-Etsu Chemical Co., Ltd., Tokyo (JP); CUSIC Inc., Sendai-shi, Miyagi (JP)

(72) Inventors: Yoshihiro Kubota, Annaka (JP); Shoji Akiyama, Annaka (JP); Hiroyuki Nagasawa, Sendai (JP)

(73) Assignees: SHIN-ETSU CHEMICAL CO., LTD., Tokyo (JP); CUSIC INC., Sendai-shi (JP)

( * ) Notice: Subject to any disclaimer, the term of this patent is extended or adjusted under 35 U.S.C. 154(b) by 65 days.

(21) Appl. No.: 15/757,879

(22) PCT Filed: Sep. 7, 2016

(86) PCT No.: PCT/JP2016/076297
§ 371 (c)(1),
(2) Date: Mar. 6, 2018

(87) PCT Pub. No.: WO2017/043528
PCT Pub. Date: Mar. 16, 2017

(65) Prior Publication Data
US 2018/0334757 A1   Nov. 22, 2018

(30) Foreign Application Priority Data
Sep. 11, 2015   (JP) ................. 2015-179290

(51) Int. Cl.
*C30B 25/20* (2006.01)
*H01L 21/762* (2006.01)
(Continued)

(52) U.S. Cl.
CPC ............ *C30B 25/20* (2013.01); *C30B 25/186* (2013.01); *C30B 29/36* (2013.01); *C30B 29/68* (2013.01);
(Continued)

(58) Field of Classification Search
CPC ......... H01L 21/76254; H01L 21/02529; H01L 29/1608; H01L 21/02002; H01L 21/02013;
(Continued)

(56) References Cited

U.S. PATENT DOCUMENTS 6,562,127 B1 * 5/2003 Kud ........................ C30B 33/06
117/915
6,964,914 B2   11/2005 Ghyselen et al.
(Continued)

FOREIGN PATENT DOCUMENTS

JP   2002-280531 A   9/2002
JP   2011-222607 A   11/2011
(Continued)

OTHER PUBLICATIONS

European Patent Office, English computer translation of JP2002280531 (2019) (Year: 2019).*
(Continued)

*Primary Examiner* — Matthew J Song
(74) *Attorney, Agent, or Firm* — Westerman, Hattori, Daniels & Adrian, LLP

(57) ABSTRACT

Provided is a method for manufacturing an SiC composite substrate 10 having a single-crystal SiC layer 12 on a polycrystalline SiC substrate 11, wherein: the single-crystal SiC layer 12 is provided on one surface of a holding substrate 21 comprising Si, and a single-crystal SiC-layer carrier 14 is prepared; polycrystalline SiC is then accumulated on the single-crystal SiC layer 12 by a physical or (Continued)

chemical means, and an SiC laminate 15 is prepared in which the single-crystal SiC layer 12 and the polycrystalline SiC substrate 11 are laminated on the holding substrate 21; and the holding substrate 21 is then physically and/or chemically removed. With the present invention, an SiC composite substrate having a single-crystal. SiC layer with good crystallinity is obtained with a simple manufacturing process.

9 Claims, 3 Drawing Sheets

(51) Int. Cl.
  *H01L 21/304* (2006.01)
  *H01L 21/02* (2006.01)
  *C30B 25/18* (2006.01)
  *C30B 29/36* (2006.01)
  *C30B 29/68* (2006.01)
  *H01L 21/78* (2006.01)

(52) U.S. Cl.
  CPC .... *H01L 21/02002* (2013.01); *H01L 21/0262* (2013.01); *H01L 21/02447* (2013.01); *H01L 21/02488* (2013.01); *H01L 21/02502* (2013.01); *H01L 21/02529* (2013.01); *H01L 21/02631* (2013.01); *H01L 21/02658* (2013.01); *H01L 21/304* (2013.01); *H01L 21/76254* (2013.01); *H01L 21/7806* (2013.01); *H01L 21/02381* (2013.01); *H01L 21/02595* (2013.01); *H01L 21/02634* (2013.01)

(58) Field of Classification Search
  CPC ......... H01L 21/02378; H01L 21/76251; H01L 21/2007; H01L 21/304; C30B 29/36
  See application file for complete search history.

(56) References Cited

U.S. PATENT DOCUMENTS

| | | | |
|---|---|---|---|
| 2010/0248445 A1* | 9/2010 | Takayama | H01L 21/76254 438/458 |
| 2015/0214040 A1* | 7/2015 | Celler | H01L 21/76254 438/458 |
| 2016/0204023 A1 | 7/2016 | Imaoka et al. | |
| 2018/0334757 A1* | 11/2018 | Kubota | C30B 25/186 |

FOREIGN PATENT DOCUMENTS

| | | |
|---|---|---|
| JP | 5051962 B2 | 10/2012 |
| JP | 2015-15401 A | 1/2015 |

OTHER PUBLICATIONS

International Search Report dated Dec. 6, 2016, issued in counterpart International Application No. PCT/ JP2016/076297 (1 page).

* cited by examiner

METHOD FOR MANUFACTURING SIC COMPOSITE SUBSTRATE, AND METHOD FOR MANUFACTURING SEMICONDUCTOR SUBSTRATE

TECHNICAL FIELD

The present invention relates to a method for manufacturing an SiC composite substrate having a single-crystal SiC layer on a polycrystalline SiC substrate and a method for manufacturing a semiconductor substrate, which are used to manufacture semiconductor elements for a power device, such as a Schottky bander diode, a pa diode, a pin diode, a field effect transistor and an insulated gate bipolar transistor (IGBT) used for power control at high temperature, high frequency and high power and to glow thin films of gallium nitride, diamond and nanocarbon.

BACKGROUND ART

Currently, single-crystal Si substrates are widely used as substrates for semiconductors. However, since the substrates are not necessarily suitable for recent high withstand voltage and high frequency due to the characteristics thereof, substrates of single-crystal SiC or single-crystal GaN are beginning to be used although they are expensive. For example, by using a semiconductor element using silicon carbide (SiC) which is a semiconductor material having a wider forbidden band width than silicon (Si) to constitute a power conversion device such as an inverter or an AC/DC converter, reduction of power loss that cannot be reached by a semiconductor element using silicon has been realized. By using the semiconductor element made of SiC, in addition to further reducing the loss accompanying electric power conversion as compared with the conventional art, weight saving, miniaturization and high reliability of the device are promoted. Moreover, the single-crystal SiC substrates are also being studied as raw materials for nanocarbon thin films (including graphene) as next generation device materials.

To manufacture these single-crystal SiC substrates and single-crystal GaN substrates, normally, (1) the single-crystal SiC substrates are manufactured by SiC sublimation method in which seed crystals are grown while SiC of high-purity SiC powder is sublimated at a high temperature of 2,000° C. or more, and (2) the single-crystal GaN substrates are manufactured by a method for growing seed crystals of GaN in high temperature and high pressure ammonia or by further heteroepitaxially growing GaN on sapphire or single-crystal SiC substrates. However, since the manufacturing steps are complicated under extremely severe conditions, the substrate quality and yield are inevitably low, making them very expensive substrates and hampering practical use and widespread use.

Meanwhile, on these substrates, the thickness that actually exhibits the device function is 0.5 to 100 μm in both cases, and the remaining thickness portion is a portion mainly playing the role of only mechanical holding and protection function during handling of the substrates, that is, a handle member (substrate).

Thereupon, in recent years, a substrate, in which a relatively thin single-crystal SiC layer which can be handled is bonded to a polycrystalline SiC substrate by intervening with a ceramic such as $SiO_2$, $Al_2O_3$, $Zr_2O_3$, $Si_3N_4$ or AlN or a metal such as Si, Ti, Ni, Cu, Au, Ag, Co, Zr, Mo or W has been studied. However, in a case where the former (ceramic) IS interposed to bond the single-crystal SiC layer and the polycrystalline SiC substrate, it is difficult to make electrodes at the time of manufacturing the device since the ceramic is an insulator. In a case of the latter (metal), it is not practical because metallic impurities are mixed in the device and the characteristics of the device tend to deteriorate.

To solve these drawbacks, various proposals have been made so far. For example, Patent Document 1 (JP 5051962) discloses a method for affixing a source substrate, in which ion implantation of hydrogen or the like is performed on a single-crystal SiC substrate having a silicon oxide thin film, to, at the silicon oxide surface, polycrystalline aluminum nitride (intermediate support, handle substrate) with silicon oxide laminated on the surface, transferring a single-crystal SiC thin film to polycrystalline aluminum nitride (intermediate carrier), thereafter depositing polycrystalline SiC and thereafter putting it in an HF bath to dissolve the silicon oxide surface and separate. However, since the bonded surface of the silicon oxide surface is usually coupled tightly and strongly, HF hardly permeates the entire surface of the silicon oxide surface, particularly the central portion. Thus, this method has drawbacks that the separation is not easy, it takes too much time, and the productivity is extremely poor. Moreover, when a large-diameter SiC composite substrate is manufactured by using this invention, a large warp occurs due to a difference in coefficients of thermal expansion between the polycrystalline SiC deposited layer and aluminum nitride (intermediate support), which is a problem.

Furthermore, Patent Document 2 (JP-A 2015-15401) discloses a method for laminating a single-crystal SiC layer on a polycrystalline SiC support substrate by thermal bonding by contacting a polycrystalline SiC support substrate surface and a single-crystal SiC surface after, for a substrate difficult to be planarized at the surface, reforming the polycrystalline SiC support substrate surface to be amorphous with high-speed atomic beams without forming an oxide film as well as reforming the single-crystal SiC surface to be amorphous. However, in this method, not only the peeling interface of the single-crystal SiC but also a part of the inside of the crystal is degenerated by the high-speed atomic beams so that the precious single-crystal SiC does not quite recover to good-quality single-crystal SiC even by subsequent heat treatment. Thus, this method has a drawback that a high-performance device or a good-quality SiC epitaxial film is difficult to be obtained when used for a device substrate, a template or the like.

In addition to these drawbacks, in order to affix single-crystal SiC and polycrystalline SiC of the support substrate with the above technique, the surface roughness of the affixing interface is indispensable to have a smoothness of 1 nm or less in arithmetic average surface roughness Ra. However, since SiC is said to be a difficult-to-cut material next to diamond, even if the single-crystal surface is reformed to be amorphous, it requires extremely a lot of time for subsequent smoothing processes such as grinding, polishing or chemical mechanical polishing (CMP) and a cost increase is inevitable. In addition, since the poly-crystal has a grain boundary, it is difficult to perform amorphization by high-speed atomic beams uniformly in the surface, and the affixing strength and occurrence of warps are problems, which are major obstacles to practical application.

PRIOR ART DOCUMENTS

Patent Documents

Patent Document 1: JP 5051962
Patent Document 2: JP-A 2015-15401

SUMMARY OF INVENTION

Technical Problem

As described above, in the conventional technique, the crystallinity of single-crystal SiC is poor, the manufacturing process is complicated, and the cost is high. Thus, there has been big problems hindering the practical application of the SiC composite substrate.

The present invention has been made in light of the above circumstances, and an object of the present invention is to provide a method for mat ifacturing SiC composite substrate, in which an SiC composite substrate having a single-crystal SiC layer with good crystallinity by a simple manufacturing process, and a method for manufacturing a semiconductor substrate.

Solution to Problem

In order to achieve the above object, the present invention provides the following method for manufacturing an SiC composite substrate and method for manufacturing a semiconductor substrate.

[1] A method for manufacturing an composite substrate having a single-crystal SiC layer on a polycrystalline SiC substrate, comprising:
providing a single-crystal SiC layer on one surface of a holding substrate made of Si to prepare a single-crystal. SiC layer carrier, thereafter
depositing polycrystalline SiC on the single-crystal SiC layer by a physical or chemical means to prepare an SiC laminate in which the single-crystal SiC layer and the polycrystalline SiC substrate are laminated on the holding substrate, and thereafter
removing the holding substrate physically and/or chemically.

[2] The method for manufacturing an SiC composite substrate according to [1], further comprising: before depositing the polycrystalline SiC on the Single-Crystal SiC layer, causing a warp in the single-crystal SiC layer carrier by applying physical damage to an opposite surface to the single-crystal. SiC layer carrying surface of the holding substrate in the single-crystal SiC layer carrier.

[3] The method for manufacturing an SiC composite substrate according to [1] or [2], further comprising: after depositing the polycrystalline SiC on the single-crystal SiC layer, applying physical damage to an opposite surface to an abutting surface of the polycrystalline SiC substrate with the single-crystal SiC layer in the SiC laminate

[4] The method for manufacturing an SiC composite substrate according to [2] or [3], wherein the physical damage is applied by at least one processing method selected from sandblasting, grinding, cutting, laser processing and electric discharge machining.

[5] The method for manufacturing an SiC composite substrate according to any one of [1] to [4], wherein the single-crystal SiC layer is provided on the one surface of the holding substrate with an intermediate layer made of silicon oxide, silicon nitride or silicon oxynitride interposed therebetween.

[6] The method for manufacturing an SiC composite substrate according to any one of [1] to [5], wherein a single-crystal SiC thin film peeled from a single-crystal SiC substrate by an ion implantation peeling method is transferred onto the holding substrate to provide the single-crystal SiC layer.

[7] The method for manufacturing an SiC composite substrate according to any one of [1] to [6], wherein the polycrystalline SiC is deposited on the single-crystal SiC layer by chemical vapor deposition.

[8] A method for manufacturing a semiconductor substrate, comprising: manufacturing air SiC composite substrate by the method for manufacturing an SiC composite substrate according to any one of claims 1 to 7, and by using the SiC composite substrate as a template, growing SiC single crystal on the single-crystal SiC layer heteroepitaxially to laminate single-crystal SiC.

Advantageous Effects of Invention

According to the present invention, since the holding substrate made of Si can be easily removed, it is possible to easily manufacture an SiC composite substrate having a single crystal SiC layer with good crystallinity.

DESCRIPTION OF EMBODIMENTS

Figure 1:
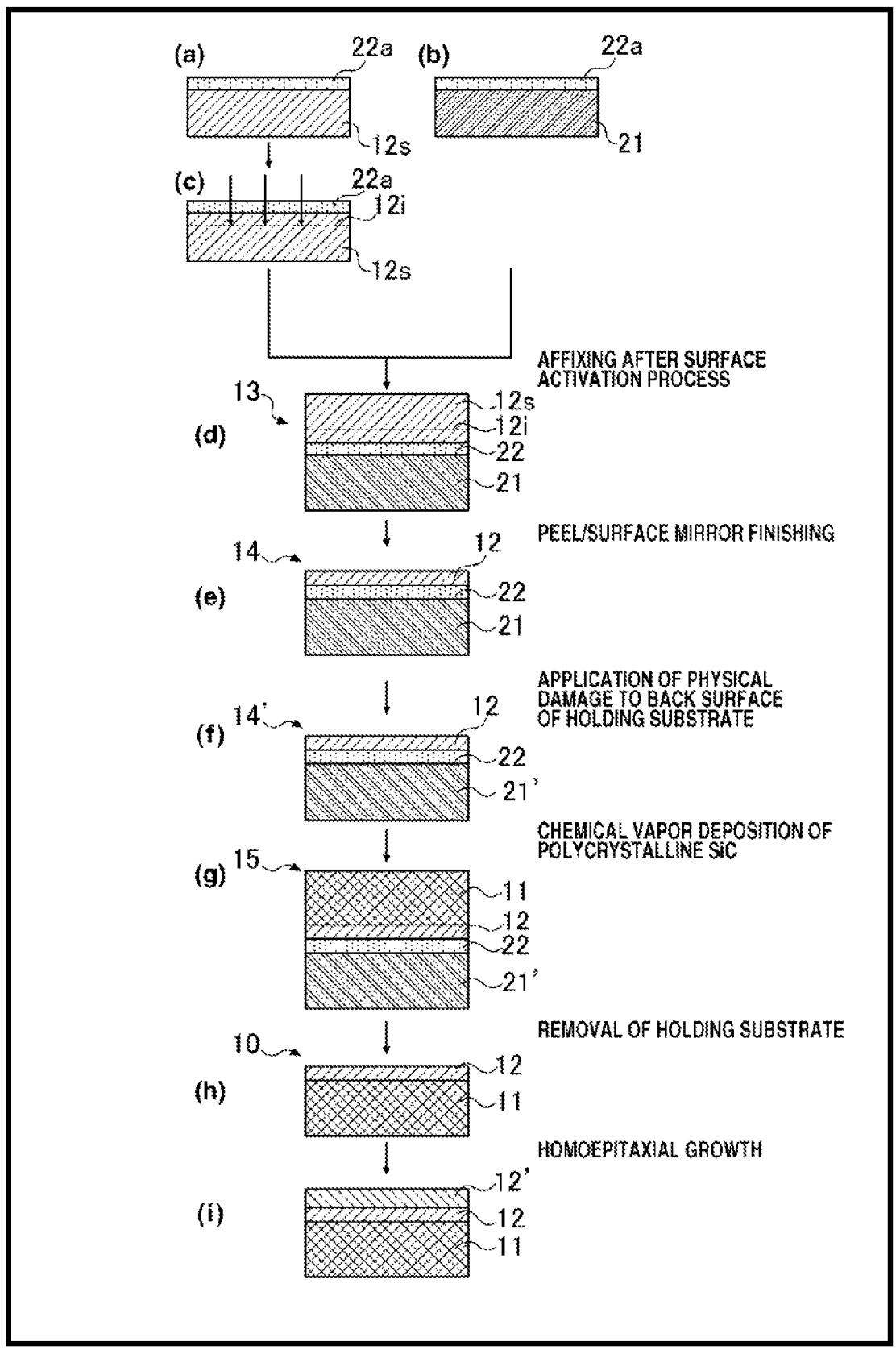
FIG. 1 is a diagram showing manufacturing steps in Embodiment 1 of a method for manufacturing an SiC composite substrate according to the present invention.

Hereinafter, a method for manufacturing an SiC composite substrate according to the present invention is described.

A method for manufacturing an SiC composite substrate according to the present invention is a method for manufacturing an SiC composite substrate having a single-crystal SiC layer on a polycrystalline SiC substrate, in which the single-crystal SiC layer, is provided on one surface of a holding substrate made of Si to prepare a single-crystal SiC layer carrier; thereafter polycrystalline SiC is deposited on the single-crystal SiC layer by a physical or chemical means to prepare an SiC laminate in which the single-crystal SiC layer and the polycrystalline substrate are laminated on the holding substrate; and thereafter the holding substrate is removed physically and/or chemically.

Herein, since a substrate made of silicon (Si) has mechanical strength and is easy to be physically and/or chemically removed (i.e., grinding or chemical etching), this substrate is suitable for the holding substrate in the manufacturing method of the present invention. Note that the holding substrate may be either a polycrystalline Si wafer or a single-crystal Si wafer. When the single-crystal Si wafer is adopted as the holding substrate, the manufacturing cost of the SiC composite substrate can be reduced because am inexpensive high-quality large-diameter substrate can be obtained.

Note that it is preferable to provide a single-crystal SiC layer on one surface of the holding substrate with an intermediate layer (also referred to as an interposition layer) made of silicon oxide, silicon nitride or silicon oxyninide interposed therebetween. This intermediate layer not only strongly adheres the single-crystal. SiC layer to the holding substrate but also can function as an etch stop layer when the majority of the holding substrate made of Si is removed by grinding or the like and then the remaining is chemically etched to be removed.

Moreover, in the method for manufacturing an SiC composite substrate of the present invention, it is preferable to transfer the single-crystal SiC thin film peeled from the single-crystal SiC substrate by an ion implantation peeling method onto the holding substrate. As a result, a single-crystal SiC layer having the minimum necessary film thickness and influencing the characteristics of the SiC composite substrate can be obtained by a single ion implantation peeling process. Thus, the SiC composite substrate with economically high-characteristics can be manufactured.

Furthermore, as a chemical or physical means for forming the polycrystalline SiC substrate, a vapor phase growth method is preferable, chemical vapor deposition is more preferable, and a thermal CVD is further preferably used. Since the polycrystalline SiC is deposited on the single-crystal SiC layer to form the substrate, it is possible to eliminate the step of high planarization by grinding, polishing, CMP or the like of SiC, which is a material difficult to be ground, as in the conventional technique.

As described above, according to the method for manufacturing an SiC composite substrate according to the present invention, since the holding substrate is not a hardly processable AlN substrate but au easily processable Si substrate, machining and chemical treatment are extremely easily performed. Thus, the holding substrate can be easily removed by simple grinding, polishing or inexpensive chemical etching process with KOH, HF or the like, and it is unnecessary to reproduce and recycle troublesome and expensive AlN as in Patent Document 1. Therefore, it is possible to manufacture a high-quality SiC composite substrate at low cost. Further, if the intermediate layer is provided between the holding substrate and the single-crystal SiC layer, the etching solution such as HF is directly in contact with the entire surface of the intermediate layer during the chemical etching process so that the intermediate layer can be easily, evenly and completely removed. As a result, the surface, of the single-crystal SiC layer can be obtained in an extremely smooth and clean state.

Incidentally, since the holding substrate made of Si has a coefficient of thermal expansion different from that of the single-crystal SiC layer or the polycrystalline SiC substrate, a warp tends to occur in the laminate including the holding substrate due to a temperature change during the manufacture of the composite substrate. If such a warp occurs in the manufacturing process, the shape of the SiC composite substrate directly reflects the warp of the holding substrate. Thus, there is a possibility that a flat substrate cannot be obtained. If the SiC composite substrate lacks flatness, not only handling of the SiC composite substrate after the next step becomes difficult, but also it becomes difficult to manufacture a fine precise device. For example, it becomes difficult to apply a photolithography step such as a device manufacturing step, and practical application of the SiC composite substrate is hindered.

Thereupon, the inventors of the present invention have conducted various investigations on the problem of this warp and grasped that the warp occurs in the SiC composite substrate as a result of thermal stress caused by a difference in coefficients of thermal expansion between the single-crystal SiC layer carrier in which the single-crystal SiC layer is carried on the holding substrate made of Si and the polycrystalline SiC When the polycrystalline SiC is deposited on the single-crystal SiC layer carrier in the manufacturing step of the SiC composite substrate. Moreover, as a result of further investigation, the inventors found out that the SiC composite substrate hardly with a warp can be obtained by applying physical damage to the holding substrate made of Si before the polycrystalline SiC is deposited on the single-crystal SiC layer carrier, releasing appropriately the thermal stress generated when the polycrystalline SiC is deposited, and depositing the polycrystalline SiC to a thickness that can withstand this thermal stress. Furthermore, the inventors found out that the SiC composite substrate hardly with, a warp can be obtained by applying physical damage sufficient to reduce the warp of the polycrystalline SiC substrate in this SiC laminate after the polycrystalline SiC is deposited on the single-crystal SiC layer carrier to form the polycrystalline SiC substrate. Based on these findings, the inventors further investigated intensively and made the present invention.

That is, it is preferable to apply a warp to the single-crystal SiC layer carrier by applying physical damage to the opposite surface to the single-crystal carrying surface of the holding substrate in the single-crystal SiC layer carrier before the polycrystalline SiC is deposited on the single-crystal SiC layer.

It is also preferable to apply physical damage to the opposite surface to the abutting surface of the polycrystalline SiC substrate with the single-crystal SiC layer in the SiC laminate after the polycrystalline SiC is deposited on the single-crystal SiC layer.

At this time, in any of the cases described above, the means for applying the physical damage is not particularly limited. From the viewpoint of the magnitude of the warp improvement effect and the efficiency, the stress may be relaxed to remove the warp by mechanical processing such as sandblasting, grinding and cutting. Alternatively, the stress may be relaxed to remove the warp by causing amorphization of the surface layer constituting the target substrate (holding substrate or polycrystalline SiC substrate) by laser processing, electric discharge machining or the like.

It is preferable to apply the physical damage so as to be as even as possible over the entire surface of the target surface of the substrate. For example, in the case of sandblasting, the entire surface of the target surface of the substrate or a partial region effective for warp improvement may be processed. Moreover, in the case of grinding and cutting, the entire surface of the target surface of the substrate or the stripes thereof with a constant pitch may be processed with a coarse fixed whetstone. Furthermore in the case of laser processing or electric discharge machining, the surface of the target surface of the substrate or the inside of the target surface side may be processed in a dotted or linear (stripe) pattern at a constant pitch.

The amount of the physical damage may be appropriately adjusted so as to cancel out the internal stress of the polycrystalline SiC substrate and the degree of the warp of the SiC laminate according to the degrees thereof.

Note that, when this physical, damage is applied to the holding substrate made of Si, the holding substrate is chemically activated by being damaged by either of the physical and chemical methods when the holding substrate is removed later, and an additional effect that the holding substrate (Si) can be removed more easily can be obtained.

As described above, the single-crystal SiC layer carrier is warped by applying the physical damage to the opposite surface of the single-crystal SiC layer carrying surface of the holding substrate in the single-crystal SiC layer carrier before the polycrystalline SiC is deposited on the single-crystal SiC layer. Thus, this warp will be a warp in the direction opposite to the warp of the polycrystalline SiC substrate to be formed thereafter so that the warp of the single-crystal SiC layer carrier and the warp of the polycrystalline SiC substrate cancel each other. Therefore, a high-quality SiC composite substrate with a small warp can be easily manufactured.

Further, the physical damage is applied to the opposite surface to the abutting surface of the polycrystalline SiC substrate with the single-crystal SiC layer in the SiC laminate after the polycrystalline SiC is deposited on the single-crystal SiC layer. Thus, the internal stress of the polycrystalline SiC substrate is reduced in the warped SiC laminate so that the warp of the SiC composite substrate can be removed. Therefore, a high-quality SiC composite substrate with a small warp can be easily manufactured.

Note that the Bow amount of the SiC composite substrate is preferably 5 μm or less and more preferably 0 μm or more and 30 μm or less.

Hereinafter, Embodiments 1 and 2 of the method for manufacturing an SiC composite substrate according to the present invention is described.

Embodiment 1

Embodiment 1 of the present invention is described with reference to FIG. 1.
(Step 1-1)

First, a single-crystal SiC substrate 12s to be affixed to a holding substrate 21 is provided. Herein, the single-crystal SiC substrate 12s is preferably selected from one having a crystal structure of 4H-SiC, 6H-SiC or 3C-SiC. The sizes of the single-crystal SiC substrate 12s and the holding substrate 21 described later are set based on the sizes and costs required for the manufacture of a semiconductor element, the growth of a gallium nitride, diamond or nanocarbon film. Moreover, the thickness of the single-crystal SiC substrate 12s is preferably in the vicinity of the substrate thickness of the SEMI standard or the TEMA standard from the viewpoint of handling. Note that, as the single-crystal SiC substrate 12s, a commercially available one, for example, a commercially available single-crystal SiC wafer for power devices may be used, and one with a flat and smooth surface, in which the surface thereof is final-polished by chemical mechanical polishing (CMP) (or planarization) process, is preferably used.

Furthermore, it is preferable to form a predetermined thin film 22a on at least the surface (front surface) of the single-crystal SiC substrate 12s to be affixed to the holding substrate 21 (FIG. 1(a)). Herein, the thin film 22a may be a dielectric film of a silicon oxide film, a silicon nitride film or a silicon oxynitride film with a thickness of about 50 nm to 600 nm. This not only facilitates the affixing to the holding substrate 21 but also has an effect of suppressing channeling of the implanted ions of ion implantation process performed thereafter. Note that the thin film 22a may be provided after the ion implantation process described later.

As a method for forming the thin film 22a, any method may be used as long as it is a film forming method capable of forming a film to the single-crystal SiC substrate 12s with good adhesion. For example, the silicon oxide film may be formed by a PECVD method or a thermal oxidation method, and the silicon nitride film or the silicon oxynitride film may be formed by a sputtering method.
(Step 1-2)

Next, the holding substrate 21 made of Si is provided. For example, a polycrystalline Si wafer or a single-crystal. Si wafer may be used.

Further, it is preferable to form a thin film 22a similar to the one in the above-described step 1-1 at least on the surface (front surface) of the holding substrate 21 to be affixed to the single-crystal SiC substrate 12s (FIG. 1(b)).
(Step 1-3)

Next; hydrogen ions or the like are implanted into the surface of the single-crystal SiC substrate 12s on which the thin film 22a is formed to form an ion implantation region 12i (FIG. 1(c)).

Herein, at the time of the ion implantation into the single-crystal SiC substrate 12s, at least hydrogen ions ($H^+$) or hydrogen molecular ions ($H_2^+$) of a predetermined dose are implanted with an implantation energy that allows the ion implantation region 12i to be formed at a desired depth from the surface. As the condition at this time, the ion implantation energy may be set so as to obtain a desired thin film thickness. He ions and B ions may be implanted at the same time, and any ions may be adopted as long as the same effects can be obtained.

The dose amount of hydrogen ions ($H^+$) to be implanted into the single-crystal SiC substrate 12s is preferably $1.0\times10^{16}$ atom/cm$^2$ to $9.0\times10^{17}$ atoms/cm$^2$. If the dose amount is less than $1.0\times10^{16}$ atoms/cm$^2$, embrittlement of the interface may not occur in some cases. If the dose amount exceeds $9.0\times10^{17}$ atom/cm$^2$, the ions may become bubbles dining thermal treatment after the joining, and transfer failure may occur in some cases.

When the hydrogen molecular ions ($H_2^+$) are used as the implanted ions, the dose amount thereof is preferably $5.0\times10^{15}$ atoms/cm$^2$ to $4.5\times10^{17}$ atoms/cm$^2$. If the dose amount is less than $5.0\times10^{15}$ atoms/cm$^2$, embrittlement of the interface may not occur. If the dose amount exceeds $4.5\times10^{17}$ atoms/cm$^2$, the ions may become bubbles during heat treatment after the affixing, and transfer failure may occur.

The depth from the surface of the ion implanted substrate to the ion implantation region 12i (i.e., ion implantation depth) corresponds to the desired thickness of the single-crystal SiC thin film provided on the holding substrate 21, is normally 100 to 2,000 nm, preferably 300 to 500 nm, and more preferably about 400 nm. Moreover, the thickness of the ion implantation region 12i (i.e., ion distribution thickness) is preferably a thickness that can be easily peeled by mechanical impact or the like, is preferably 200 to 400 nm, and more preferably about 300 nm.
(Step 1-4)

Subsequently, the surface of the single-crystal SiC substrate 12s on which the thin film 22a is formed and the surface of the holding substrate 21 on which the thin film 22a is formed (front surfaces) are affixed by surface activation process. As the surface activation process, plasma activation process, vacuum ion beam process or immersion process into ozone water may be performed.

Among them, when the plasma activation process is performed, the single-crystal SiC substrate 12s and/or the holding substrate 21 which have been subjected to up to the above-described step 1-3 are placed in a vacuum chamber, and plasma gas is introduced under reduced pressure. Thereafter, the substrates are exposed to high frequency plasma of about 100 W for about five to ten seconds, thereby the surfaces are subjected to the plasma activation process. As the plasma gas, oxygen gas, hydrogen gas, nitrogen gas, argon gas, mixed gas thereof, or mixed gas of hydrogen gas and helium gas can be used.

In the vacuum ion beam process, the single-crystal SiC substrate 12s and/or the holding substrate 21 are placed in a high vacuum chamber, and the surfaces to be affixed are irradiated with ion beams such as Ar to perform activation process.

In the immersion process in the ozone water, the single crystal SiC substrate 12s and/or the holding substrate 21 is immersed in the ozone water in which ozone gas is dissolved, thereby the surface thereof is subjected to activation process.

Although the surface activation process described above may be performed only on the single-crystal SiC substrate 12s or only on the holding substrate 21, it is more preferable to perform the surface activation process on both the single-crystal SiC substrate 12s and the holding substrate 21.

Moreover, the surface activation process may be any one of the above-described methods, or a combination process may be performed. Furthermore, the surfaces of the single-crystal SiC substrate 12s and the holding substrate 21 subjected to the surface activation process are preferably the surfaces to be affixed, that is, the surfaces of the thin films 22a.

Next, the surfaces of the single-crystal SiC substrate 12s and the holding substrate 21 (surfaces of the thin films 22a and 22a) which have been subjected to the surface activation process are affixed as bonded surfaces.

Then, after the single-crystal SiC substrate 12s and the holding substrate 21 are affixed, heat treatment is preferably performed at 150 to 350° C. more preferably 150 to 250° C., and the coupling strength of the affixed surfaces of the thin films 22a and 22a should be enhanced. At this time, a warp occurs in the substrate due to a difference in coefficients of thermal expansion between the single-crystal SiC substrate 12s and the holding substrate 21, but the warp should be suppressed by adopting a temperature suitable for each material. The time for the heat treatment depends on the temperature to some extent, and is preferably 2 hours to 24 hours.

As a result, the thin films 22a and 22a are brought into close contact with each other to become one layer, an interposition layer 22, and the single-crystal SiC substrate 12s and the holding substrate 21 are strongly attached with the interposition layer 22 to become an affixed substrate 13 (FIG. 1(*d*)).

(Step 1-5)

As for the affixed substrate 13, thermal energy or mechanical energy is applied to the ion implanted portion, and the single-crystal SiC thin film peeled from the single-crystal SiC substrate 12s in the ion implantation region 12i is transferred onto the holding substrate 21.

At this time, the thin films 22a and 22a are strongly adhered to each other, and further, the thin films 22a and 22a are strongly attached to the single-crystal SiC substrate 12s and the holding substrate 21, respectively. Thus, no peeling occurs in portions other than the peeled portion in the ion implantation region 12i.

As a peeling method, for example, a heat peeling method can be applied, in which the affixed substrate 13 is heated to a high temperature, and a minute bubble body of the ion implanted component is generated in the ion implantation region 12i by this heat, thereby causing the peeling to separate the single-crystal SiC substrate 12s. Alternatively, a mechanical peeling method can be applied, in which, while low temperature heat treatment (e.g., 500 to 900° C., preferably 500 to 700° C.) is performed to such an extent that thermal peeling does not occur, a physical impact is applied to one end of the ion implantation region 12i, thereby causing the peeling to separate the single-crystal SiC substrate 12s. The mechanical peeling method is more preferable because the roughness of the transfer surface after the transfer of the single-crystal SiC thin film is relatively smaller than that in the heat peeling method.

Note that heat treatment may be performed, in which the single-crystal SiC thin film carrier is heated after the peeling process under the conditions that the heating temperature is 700 to 1,000° C., which is higher than that at the time of the peeling process and a heating time is 1 to 24 hours to improve the adhesion between the single-crystal SiC thin film and the holding substrate 21.

The surface of the single-crystal SiC thin film on the holding substrate 21 is minor finished to become a single-crystal SiC layer 12, and a single-crystal. SiC layer carrier 14 is obtained (FIG. 1(*e*)). Specifically, chemical mechanical polishing (CMP polishing) is performed on the single-crystal SiC thin film to remove the damaged layer due to the ion implantation as well as minor finish the surface. Herein, conventionally known CMP polishing used to planarize or the like a silicon wafer may be used.

Moreover, the single-crystal SiC layer 12 is a thin film made of single-crystal SiC with a thickness of 5 μm or less, preferably 2 μm or less, more preferably 100 nm or more and 1 μm or less, further preferably 200 nm or more and 800 nm or less, and particularly preferably 300 nm or more and 500 nm or less. If the thickness of the single-crystal SiC layer is 5 μm or less, there is still an economic merit more than a pure single-crystal SiC substrate even in consideration of the cost of forming a composite substrate.

Note that the single-crystal SiC substrate 12s after the peeling can be reused again to as a substrate for affixing in the manufacturing method of the single-crystal SiC layer carrier 14 by again polishing, cleaning and the like the surface.

(Step 1-6)

Next, physical damage is applied to the opposite surface (the back surface, the surface on the lower side in the drawing) to the single-crystal SiC layer carrying surface of the holding substrate 21 in the single-crystal SiC layer carrier 14 to cause a warp in the single-crystal SiC carrier 14' (FIG. 1(*f*). In the drawing, the reference numeral 14' denotes the single-crystal SiC layer carrier after the physical damage is applied, and the reference numeral 21' denotes the holding substrate after the physical damage is applied.

Herein, the physical damage may be applied by at least one processing method selected from sandblasting, grinding, cutting, laser processing and electric discharge machining as described above.

As a result, the single-crystal SiC layer carrier 14' slightly warps so as to be convex in the direction opposite to the warp caused by the internal stress of the polycrystalline SiC substrate 11 described later (e.g., on the single-crystal SiC layer 12 side (upper side)).

(Step 1-7)

Next, polycrystalline SiC is deposited on the single-crystal SiC layer 12 by chemical vapor deposition by using the obtained single-crystal SiC layer carrier 14' to form a polycrystalline SiC substrate 11, thereby obtaining an SiC laminate 15 (FIG. 1(*g*)). This SiC laminate 15 here has a structure in which an intermediate layer 22, the single-crystal SiC layer 12, and the polycrystalline SiC substrate 11 are laminated in this order on the holding substrate 21'.

Herein, it is preferable to use a thermal CVD as the chemical vapor deposition. The conditions of this thermal CVD may be general conditions for forming a film by depositing polycrystalline SiC.

The thickness of the polycrystalline SiC substrate 11 is preferably 50 to 1,000 μm, and more preferably 100 to 800 μm. The function as the handle substrate can be easily secured by setting the thickness to 50 μm or more, and it is possible to suppress the cost by setting the thickness to 1,000 μm or less.

Moreover, the polycrystalline SiC of the polycrystalline SiC substrate 11 is preferably cubic (3C-SiC). Note that impurities may be introduced into the polycrystalline SiC substrate 11 to adjust the resistivity. This makes it possible to suitably use the substrate as a substrate of a vertical power semiconductor device.

(Step 1-8)

Next, the SiC composite substrate 10 is obtained by physically and/or chemically removing the holding substrate 21' in the SiC laminate 15 obtained in the step 1-7 (FIG. 1(h)). At this time, since the holding substrate 21' is made of silicon, for example, it is preferable to remove the majority of the holding substrate 21' by grinding first and then selectively remove the remaining holding substrate 21' and the intermediate layer 22 by etching with a nitrohydrofluoric solution.

As a result, the SiC composite substrate 10 hardly with a warp is obtained. At this time, since the polycrystalline SiC substrate 11 is made of the same SiC as the upper single-crystal SiC layer 12 and the coefficients of the thermal expansion of the single-crystal SiC layer 12 and the polycrystalline SiC substrate 11 become substantially equal, occurrence of a warp of the SiC composite substrate 10 is suppressed at any temperature.

(Step 1-9)

SiC epitaxial, layer 12' may be formed on the single-crystal SiC layer 12 of the SiC composite substrate 10 as necessary (FIG. 1(i)). As a result, even when the single crystal SiC layer 12 is too thin to be used as an active layer of a power semiconductor device, the SiC epitaxial layer 12' with a predetermined thickness is formed so that an SiC composite substrate adapted for manufacturing a power semiconductor can be obtained.

Embodiment 2

Figure 2:
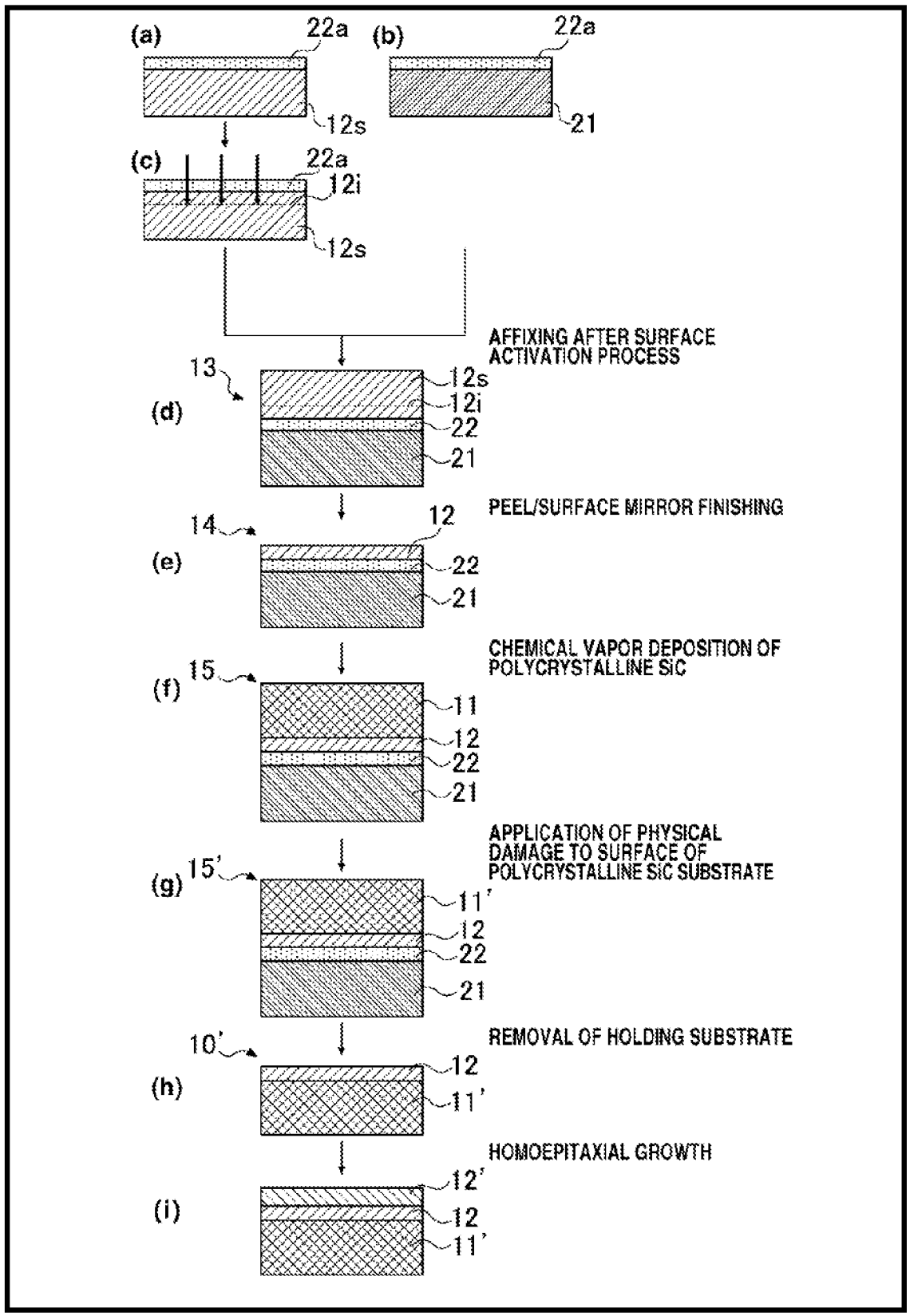
FIG. 2 is a diagram showing manufacturing steps in Embodiment 2 of the method for manufacturing an SiC composite substrate according to the present invention.

Embodiment 2 of the present invention is described with reference to FIG. 2. Note that manufacturing steps in the present embodiment until the single-crystal SiC layer cannier 14 in which the single-crystal SiC layer 12 is carried on the holding substrate 21 is prepared (up to FIG. 2(e)) are the same as the manufacturing steps up to 1-5 (FIG. 1(e)) in Embodiment 1. The following steps are described herein.

(Step 2-6)

Polycrystalline SiC is deposited on the single-crystal SiC layer 12 by chemical vapor deposition by using the obtained single-crystal SiC layer carrier 14 to form the polycrystalline SiC substrate 11, thereby obtaining the SiC laminate 15 (FIG. 2(f)). The conditions of the chemical vapor deposition and the polycrystalline SiC substrate 11 may be the same as those in Embodiment 1. This SiC laminate 15 here has a structure in which the intermediate layer 22, the single-crystal SiC layer 12, and the polycrystalline SiC substrate 11 are laminated in this order on the holding substrate 21.

(Step 2-7)

Next, physical damage is applied to the opposite surface (exposed surface, upper surface in the drawing) to the abutting surface of the polycrystalline SiC substrate 11 with the single-crystal SiC layer 12 in the SiC laminate 15 (FIG. 2(g)). In the drawing, the reference numeral 15' denotes the SiC laminate after the physical damage is applied, and the reference numeral 11' denotes the polycrystalline SiC substrate after the physical damage is applied.

Thus, by applying the physical damage to the surface of the polycrystalline SiC substrate 11 in the SiC laminate 15, the internal stress of the polycrystalline SiC substrate 11 can be reduced.

(Step 2-8)

Next, the SiC composite substrate 10' having the single-crystal SiC layer on the polycrystalline SiC substrate 11' is obtained by physically and/or chemically removing the holding substrate 21 in the SiC laminate 15' obtained in the step 2-7 (FIG. 2(h)). The method and conditions for removing the holding substrate 21 may be the same as those in Embodiment 1.

As a result the SiC composite substrate 10' hardly with a warp is obtained. At this time, since the polycrystalline SiC substrate 11' is made of the same SiC as the upper single-crystal SiC layer 12 and the coefficients of the thermal expansion of the single-crystal SiC layer 12 and the polycrystalline SiC substrate 11' become substantially equal, occurrence of a warp of the SiC composite substrate 10' is suppressed at any temperature.

(Step 2-9)

The SiC epitaxial layer 12' may be formed on the single-crystal SiC layer 12 of the SiC composite substrate 10 as necessary (FIG. 2(i)).

Note that, as a manufacturing method of the present invention. Embodiment 1 and Embodiment 2 may be combined. That is, physical damage is applied to the opposite surface to the surface of the single-crystal SiC layer carrier of the holding substrate 21 in the single-crystal SiC layer carrier 14 in Embodiment 1 to cause a warp of the single-crystal SiC layer carrier 14', and the polycrystalline SiC substrate 11 is formed on the single-crystal SiC layer 12. Thereafter, physical damage may be applied to the surface of the polycrystalline SiC substrate 11 in the SiC laminate 15, and thereafter the holding substrate 11' may be removed.

EXAMPLES

Figure 3:
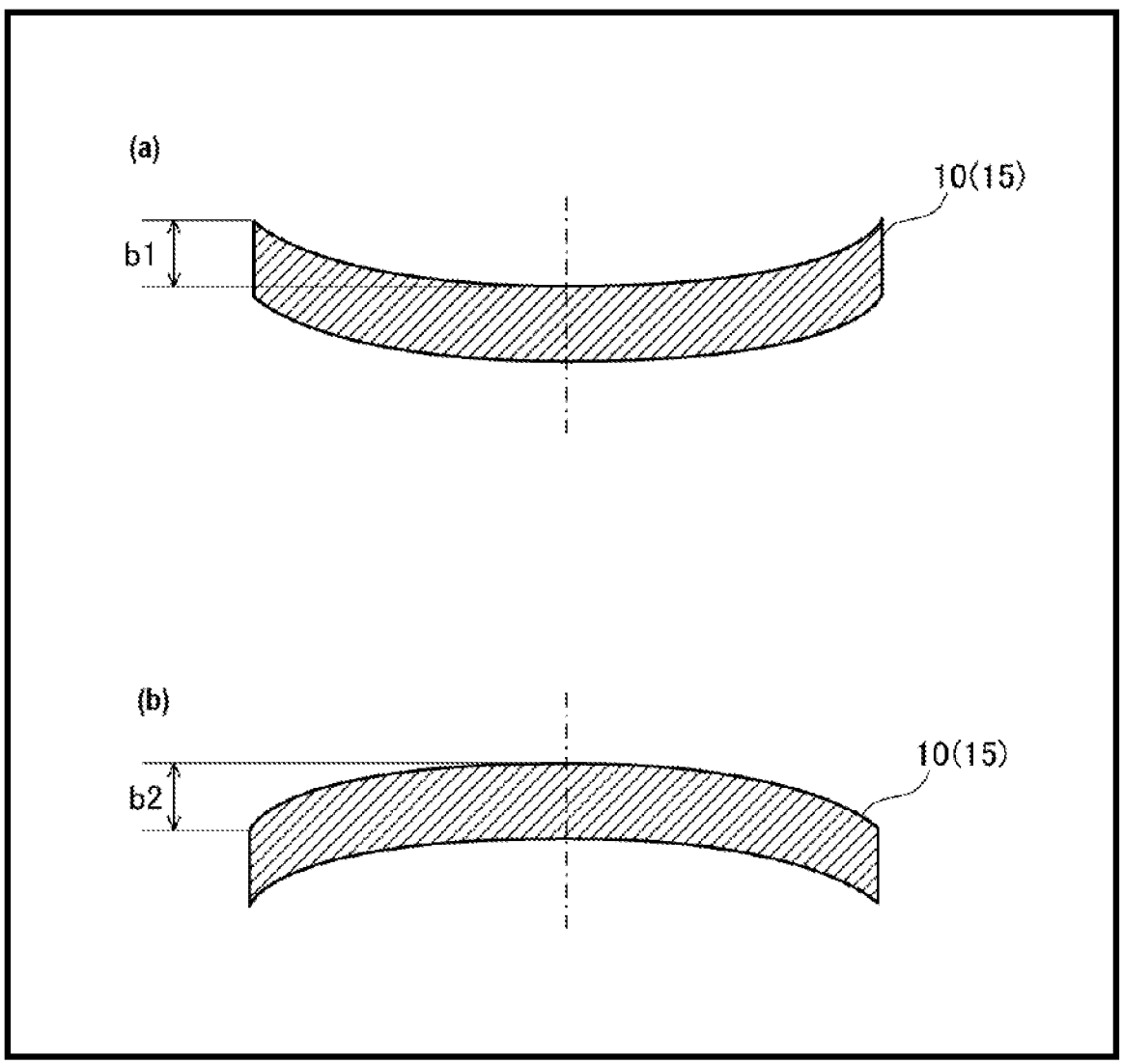
FIG. 3 is a schematic diagram showing a method of measuring the Bow amount of the substrate.

Hereinafter, the present invention is described more in detail with reference to Examples and a Comparative Example, but the present invention is not limited to the Examples. Note that, as the warp of the substrate, the Bow amount was measured by a Fizeau interferometer of normal incidence type (FlatMaster manufactured by Corning Tropel). Herein, as shown in FIG. 3. Bow amounts b1 and b2 were measured as the differences in height between the central portion and the end portion of the SiC composite substrates 10, 10' or the SiC laminates 15, 15'. When the central portion of the substrate is convex in a downward direction as shown in FIG. 3(a). The Bow amount is a negative value. When the central portion of the substrate is convex in an upward direction as shown in FIG. 3(b), the Bow amount is a positive value. Note that the warp was measured by disposing the single-crystal SiC layer 12 of the SiC composite substrate 10' or the SiC laminate 15, 15' to the upper side (sur ace side).

Example 1

In the present Example, an SiC composite substrate was manufactured as follows in accordance with the procedure of Embodiment 1 of the present invention.

First, a 4H-SiC single-crystal wafer having a diameter of four inches was provided as the single-crystal SiC substrate 12s. $H^+$ ions were ion implanted into one surface of the single-crystal SiC substrate 12s so as to have an ion implantation depth of 700 nm. Thereafter, a silicon oxide film with a thickness of 300 nm was formed as the thin film 22a on the ion implantation surface (front surface) by a thermal oxidation method.

Moreover, as the holding substrate 21, a single-crystal Si wafer with a diameter ϕ of four inches was provided, and a silicon oxide film with a thickness of 300 nm was formed on one surface (front surface) thereof (FIG. 1(b)).

Subsequently, plasma activation process was performed on both the silicon oxide film formation surfaces of the single-crystal SiC substrate 12s and the holding substrate 21. Thereafter, the silicon oxide film formation surfaces (front surfaces) of the two substrates were affixed to prepare the affixed substrate 13 (FIG. 1(d)).

Next, a mechanical impact was applied to the ion implantation region 12i of the single-crystal SiC substrate 12s in the affixed substrate 13 to peel the single-crystal SiC thin film from the singly crystal SiC substrate 12s, and the thin film, was transferred to tide holding substrate 21. After this removal of the damaged layer on the surface of the single-crystal SiC thin film, the surface was polished, and the single-crystal SiC layer carrier 14, in which a 4H-SiC single-crystal SiC layer 12 with a thickness of 640 nm was carried on the holding substrate 21 with the silicon oxide film (intermediate layer 22), was obtained (FIG. 1(e)).

Subsequently, the entire surface of the opposite surface (back surface) to the single-crystal SiC layer 12 carrying surface of the holding substrate 21 in this single-crystal SiC layer carrier 14 was irradiated with single mode laser beams with a laser output of 1.5 W, a repetition frequency of 90 kHz and a laser wavelength of 1064 nm at a focal depth of 140 μm, a pitch of 0.3 mm, and a scanning speed of 350 minis to apply the physical damage. At this time, the single-crystal SiC layer earlier 14 was not cracked, and the central portion of the substrate was deformed to be slightly convex in an upward direction (FIG. 1(f)).

Next, on the single-crystal SiC layer 12 of the single-crystal SiC layer carrier 14' after this physical damage was applied, thermal CVD was performed using silicon tetrachloride and propane as raw materials under the conditions of a temperature of 1330° C. and a pressure of 17 Pa for six hours, and polycrystalline SiC of 3C-SiC was deposited to form the polycrystalline SiC substrate 11 with a thickness of 610 μm, thereby preparing the SiC laminate 15 (FIG. 1(g)). At this time, since the single-crystal SiC layer carrier 14' was slightly warped as described above, the thermal stress generated at the time of forming the polycrystalline SiC substrate 11 was canceled out, and the SiC laminate 15 hardly with a warp was obtained.

Subsequently, the holding substrate 21' of this SiC laminate 15 was ground with a fixed whetstone. Specifically, the fixed whetstone was sequentially changed in order of #1000, #2500, and #4000 to finer whetstones, and the grinding was performed until the holding substrate 21 almost disappeared. Subsequently, the intermediate layer 22 of the silicon oxide film was removed by etching with an HF aqueous solution, and the SiC composite substrate 10 having the single-crystal SiC layer 12 whose surface is extremely smooth and clean on the polycrystalline SiC substrate 11 was obtained at much lower cost than a pure single-crystal SiC substrate (FIG. 1(h)). The Bow amount of this SiC composite substrate 10 was +20 μm, which indicates a state where almost no warp exists.

Note that homoepitaxial growth of single-crystal SiC was further performed for two hours with dichlorosilane and acetylene at 1,550° C. using the obtained SiC composite substrate 10 as an SiC template, and an SiC epitaxial layer 12' with a thickness of 20 μm was laminated (FIG. 1(i)). The SiC epitaxial substrate thus obtained was extremely useful as a substrate for power devices with high withstand voltage of 1 KV or higher and high capacity.

Comparative Example 1

In Example 1, an SiC composite substrate was prepared under the same conditions as in Example 1 except that the physical damage Was not applied to the single-crystal SiC layer carrier 14 by laser beam irradiation.

The Bow amount of the obtained SiC composite substrate was as extremely large as +3 mm, which was inferior in compatibility with the process of device manufacturing, and as a result, the yield of device manufacture was greatly reduced.

Example 2

In the present Example, an SiC composite substrate was manufactured as follows in accordance with the procedure of Embodiment 2 of the present invention.

The single-crystal SiC layer carrier 14 was prepared in the same manner as in Example 1 except that the intermediate layer 22 was changed from a silicon oxide film to a silicon oxynitride film in preparation of the single-crystal SiC layer carrier 14 in Example 1 (FIG. 2(e)).

Next, on the single-crystal SiC layer 12 of the single-crystal SiC layer carrier 14, thermal CVD was performed using silicon tetrachloride and propane as raw materials under the conditions of a temperature of 1,350° C. and a pressure of 20 Pa for five hours, and polycrystalline SiC of 3C-SiC was deposited to form the polycrystalline SiC substrate 11 with a thickness of 500 μm, thereby preparing the SiC laminate 15 (FIG. 2(f)). At this time, a large warp of +3.5 mm in Bow amount of the SiC laminate 15 had occurred.

Subsequently, sandblasting was performed as physical damage on the entire surface of the opposite surface (exposed surface) to the abutting surface of the polycrystalline SiC substrate 11 with the single-crystal SiC layer 12 in this SiC laminate 15, and unevenness with a Pv value (a maximum valley depth of a cross-sectional curve (JIS B0601: 2013) of 50 μm was formed on the surface thereof (FIG. 2(g)). As a result, the Bow amount of the SiC laminate 15' was greatly reduced to +50 μm.

Subsequently, the holding substrate 21 of this SiC laminate 15' was ground and polished. Specifically, grinding was performed by gradually changing the count of the fixed whetstone to #1000, #2500, #4000 in this order of fine grinding stones and fine free abrasive grains, and then polishing was performed by CMP process. As a result, the holding substrate 21 had almost disappeared. Subsequently, the intermediate layer 22 of the silicon oxynitride film was removed by etching with an HF aqueous solution, and the SiC composite substrate 10 having the single-crystal SiC layer 12 whose surface is extremely smooth and clean on the polycrystalline SiC substrate 11' was obtained (FIG. 2(h)). The Bow amount of this SiC composite substrate 10' was +35 μm, which indicates a state with an extremely small warp.

Note that heating was preformed in a high-frequency heating furnace at a temperature of 1,550° C. under a pressure of 1 bar ($1 \times 10^5$ Pa) in an Ar atmosphere for 10 minutes by using the obtained SiC composite substrate 10' to perform graphene formation. As a result of Raman analysis of the obtained graphene a sharp characteristic peak derived from graphene was observed in the G band and the G' band, indicating the generation of high-quality graphene.

Note that, although the present invention has been described with reference to the embodiments shown in the drawings so far, the present invention is not limited to the embodiments shown in the drawings and can be changed within a scope that a person skilled in the art can conceive, such as other embodiments, additions, modifications and deletions, and any aspects are included in the scope of the present invention as long as the effects of the present invention are exhibited.

REFERENCE SIGNS LIST 10, 10' SiC composite substrate
11, 11' polycrystalline SiC substrate
12 single-crystal SiC layer
12$i$ ion implantation region
12$s$ single crystal SiC substrate
12' SiC epitaxial layer
13 affixed substrate
14, 14' single-crystal SiC layer carrier
15, 15' SiC laminate
21, 21' holding substrate
22 intermediate layer (interposition layer)
22$a$ think film

The invention claimed is:

1. A method for manufacturing an SiC composite substrate having a single-crystal SiC layer on a polycrystalline SiC substrate, comprising:

providing a single-crystal SiC layer on one surface of a holding substrate made of Si to prepare a single-crystal SiC layer carrier, thereafter (i) causing warp in the single-crystal SiC layer carrier by applying physical damage to a surface opposite to the single-crystal SiC layer-carrying surface of the holding substrate in the single-crystal SiC layer carrier, and then depositing polycrystalline SiC on the single-crystal SiC layer by a physical or chemical means to prepare an SiC laminate in which the single-crystal SiC layer and the polycrystalline SiC substrate are laminated on the holding substrate, or (ii) depositing polycrystalline SiC on the single-crystal SiC layer by physical or chemical means to prepare an SiC laminate in which the single-crystal SiC layer and the polycrystalline SiC substrate are laminated on the holding substrate, and then applying physical damage to a surface opposite to a surface of the polycrystalline SiC substrate abutting with the single-crystal SiC layer in the SiC laminate to prepare an SiC laminate in which the single-crystal SiC layer and the polycrystalline SiC substrate are laminated on the holding substrate, and thereafter removing the holding substrate physically and/or chemically.

2. The method for manufacturing an SiC composite substrate according to claim 1, wherein the physical damage is applied by at least one processing method selected from sandblasting, grinding, cutting, laser processing and electric discharge machining.

3. The method for manufacturing an SiC composite substrate according to claim 1, wherein the single-crystal SiC layer is provided on the one surface of the holding substrate with an intermediate layer made of silicon oxide, silicon nitride or silicon oxynitride interposed therebetween.

4. The method for manufacturing an SiC composite substrate according to claim 1, wherein a single-crystal SiC thin film peeled from a single-crystal SiC substrate by an ion implantation peeling method is transferred onto the holding substrate to provide the single-crystal SiC layer.

5. The method for manufacturing an SiC composite substrate according to claim 1, wherein the polycrystalline SiC is deposited on the single-crystal SiC layer by chemical vapor deposition.

6. A method for manufacturing a semiconductor substrate, comprising: manufacturing an SiC composite substrate by the method for manufacturing an SiC composite substrate according to claim 1, and by using the SiC composite substrate as a template, growing SiC single crystal on the single-crystal SiC layer heteroepitaxially to laminate single-crystal SiC.

7. The method for manufacturing an SiC composite substrate according to claim 1, wherein the step (i) further comprises after depositing the polycrystalline SiC on the single-crystal SiC layer, applying physical damage to a surface opposite to a surface of the polycrystalline SiC substrate abutting with the single-crystal SiC layer in the SiC laminate.

8. The method for manufacturing an SiC composite substrate according to claim 1, wherein the amount of the physical damage is adjusted so as to cancel out the internal stress of the deposited polycrystalline SiC substrate and the degree of the warp of the SiC laminate.

9. The method for manufacturing an SiC composite substrate according to claim 1, wherein the physical damage is applied by sandblasting, laser processing or electric discharge machining.

* * * * *